United States Patent [19]

Bruchez

[11] 3,766,449

[45] Oct. 16, 1973

[54] TRANSISTORS

[75] Inventor: Jeffrey Alan Bruchez, Hazel Grove, Cheshire, England

[73] Assignee: Ferranti Limited, Lancashire, England

[22] Filed: Mar. 27, 1972

[21] Appl. No.: 238,278

[52] U.S. Cl...... 317/235 R, 317/235 Z, 317/235 AE

[51] Int. Cl. .............................................. H01l 9/00

[58] Field of Search ..................................... 317/235

[56] References Cited

UNITED STATES PATENTS

| | | | |
|---|---|---|---|
| 3,657,612 | 4/1972 | Wiedmann | 317/235 |
| 3,631,309 | 12/1971 | Myers | 317/235 |
| 3,462,658 | 8/1969 | Worchel et al. | 317/235 |

*Primary Examiner*—John W. Huckert

*Assistant Examiner*—E. Wojciechowicz

*Attorney*—Edward J. Kondracki

[57] ABSTRACT

A transistor having a high inverse gain value, and especially a multi-emitter transistor, is provided both with an additional feedback emitter directly connected to the base and positioned adjacent to the base contact, together with a base resistor portion between the region of the base having the base contact and the additional emitter and the region of the base in which each other emitter is formed.

11 Claims, 5 Drawing Figures

TRANSISTORS

Figure 1:
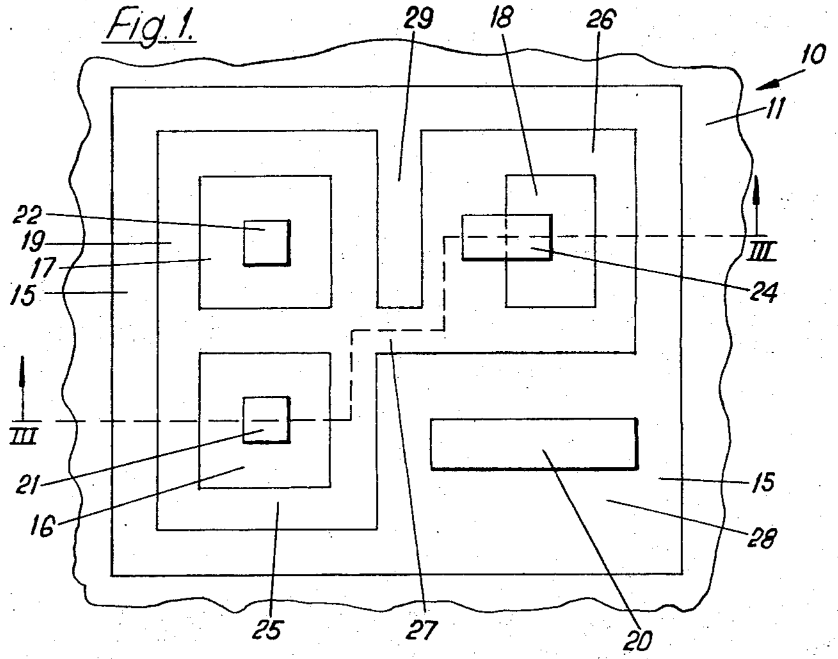

This invention relates to transistors.

Some forms of construction of transistors have high inverse gain values, especially transistors which are provided in shallow epitaxial layers on semiconductor substrates, for example, transistors having the so-called collector-diffusion-isolation construction. A high inverse gain value for a transistor implies that the transistor has a high inverse leakage current when the collector-base P-N junction is forward biased and the emitter is at a high potential level, the inverse current leakage being caused by charge carriers being re-injected into the base from the collector.

When more than one emitter is provided, in the operation of the transistor, different emitters may be at different potential levels. Thus, unwanted current leakage may occur between the emitters, charge carriers being injected into the base by an emitter at a low potential level, and these charge carriers "being collected" by an emitter at a high potential level after being re-injected by the collector.

It is known to reduce the inverse current leakage by a combination of doping the device with a material such as gold which decreases the lifetime of stored minority charge carriers, and by having a base with a first region, in which the emitter or emitters are provided, connected by a resistor portion to a second region, to which the base contact is provided. The provision of the resistor portion reduces the leakage current due to charge carriers being re-injected by the collector, by biasing off the part of the collector-base P-N junction closest to the emitters, and so there is less injection of charge carriers into the first region of the base in which the emitters are provided. Previously, gold doping has been necessary in order to improve the switching time of the transistor when employed as a current switch. However, it is undesirable to dope any form of device with gold as this step reduces manufacturing yields and is an extra processing step. This is especially so for devices provided in shallow epitaxial layers, and gold doping generally is not done when manufacturing such devices.

It is an object of the present invention to provide a transistor having a high inverse current gain value and which has a low current leakage due to charge carriers being re-injected by the collector, and a fast switching speed without requiring the device to be doped with gold.

According to the present invention a transistor having a high inverse current gain value includes a collector, a base comprising a first region connected to a second region by a resistor portion, a base contact to the second region, at least one emitter within the first region and an additional, feedback emitter adjacent to the base contact and directly connected to the base.

The additional, feedback emitter "collects" charge carriers re-injected by the collector and feeds them back to the base, causing the transistor to have a fast switching speed. Thus, both the desired reduction in the current leakage and a fast switching speed is obtained. The positioning of the additional emitter adjacent to the base contact implies that the feedback current has an optimum value. This is because the majority of the re-injection of charge carriers from the collector now takes place adjacent to the base contact because of the provision of the base resistor portion.

Figure 2:
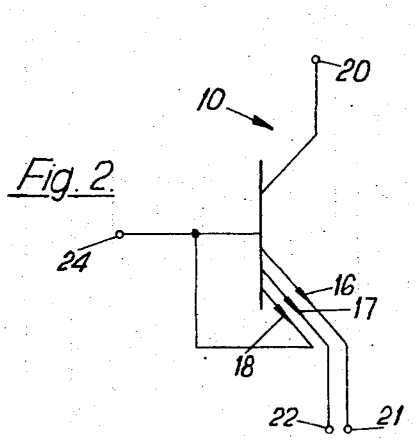
Figure 3:
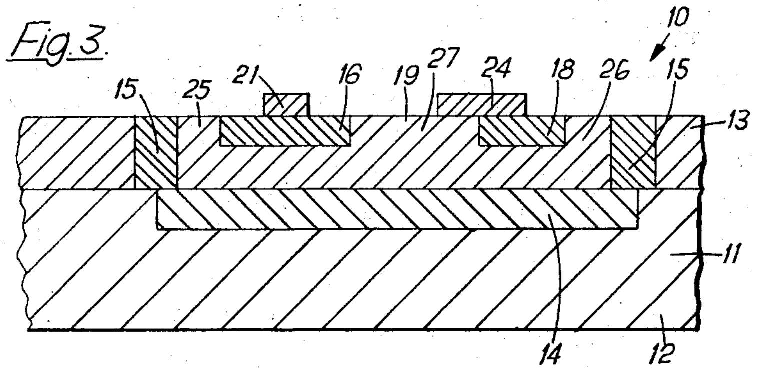
Figure 4:
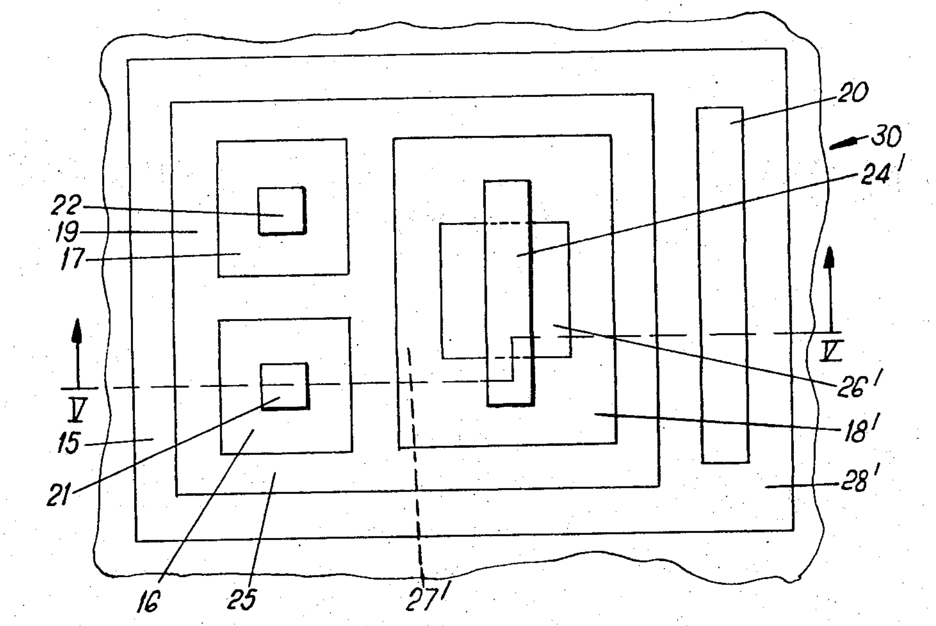
Figure 5:
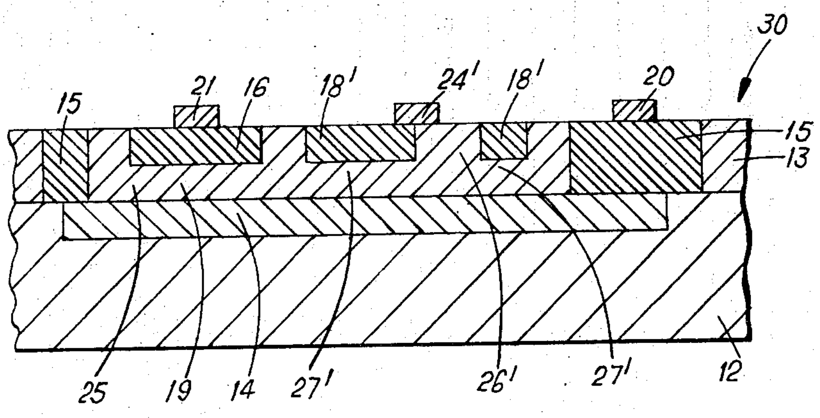

The present invention will now be described by way of example with reference to the accompanying drawings, in which FIG. 1 is a plan view of one embodiment of a multi-emitter transistor according to the present invention, FIG. 2 is a circuit diagram of the semiconductor device of FIG. 1, FIG. 3 is a section on the line III - III of FIG. 1, FIG. 4 is a plan view of a second embodiment of a multi-emitter transistor according to the present invention, and FIG. 5 is a section on the line V - V of FIG. 4.

The illustrated multi-emitter N-P-N transistor 10 comprises part of a semiconductor integrated circuit having a semiconductor body with a P type substrate 12 and a shallow P-type epitaxial layer 13. The transistor 10 is of the so-called collector-diffusion-isolation construction, and is manufactured by a known method. The collector comprises both a buried N+ type layer 14 at the interface between the epitaxial layer 13 and the substrate 12, together with an N+ type isolation barrier 15 around the device 10 and extending through the epitaxial layer to the N+ type buried layer 14. Two N+ type emitters 16 and 17, and an additional, feedback emitter 18, are diffused into the P type epitaxial base 19 defined by the collector 14, 15. A silicon oxide passivating layer is provided on the surface of the transistor this layer not being shown in the Figures. Contacts 20, 21 and 22 are provided respectively to the collector 14, and to the emitters 16 and 17; and a common contact 24 is provided to the base 19 and to the additional emitter 18, the contact 24 spanning a part of the P-N junction between the base and the additional emitter. The emitters 16 and 17 are within a first region 25 of the base, and the base contact 24, and the additional emitter 18 are respectively on and within a second region 26 of the base 19 which is connected to the first region 25 by a resistor portion 27. The cross-sectional area of the base transverse to the direction of movement of charge carriers between the base contact 24 and the emitters 16 and 17 within the first region 25 is smaller for the resistor portion 27 than for the first region 25. The resistor portion 27 is defined between a part 28 of the collector having the collector contact 20 and a tongue part 29 of the collector extending between the first region 25 of the base and the second region 26 of the base having the base contact 24.

The provision of the resistor portion 27 causes the part of the collector-base P-N junction adjacent to the emitters 16 and 17 within the first region of the base to be biased off. Hence, the number of charge carriers re-injected from the collector into the first region of the base adjacent to the emitters 16 and 17 is reduced, reducing the inverse current leakage of the device, when the collector-base P-N junction is forward biased and at least one of the emitters 16 and 17 is at a high potential level. A component of the unwanted leakage current occurs due to transistor action between the emitters 16 and 17. This transistor action is when one emitter 16 or 17 is at a lower potential level than the other, and charge carriers are injected by the emitter at the lower potential level into the base and are re-injected by the collector "to be collected" by the emitter at the higher potential level. However, the provision of the resistor base portion 27 also reduces the magnitude of this current leakage. The majority of charge carrier re-injection takes place adjacent to the base contact 24 and the additional emitter 18 "collects" the charge carriers and feeds them back to the base. Hence, the additional, feedback emitter 18 causes a reduction of stored charge within the device when it is in a saturated condition. Thus, the switching time of the device is reduced when employed as a current switch.

A second embodiment of a multi-emitter transistor according to the present invention is shown at 30 in FIGS. 4 and 5. The transistor 30 also may be represented by the circuit diagram of FIG. 2, and parts of the transistor 30 either closely resembling or identical to parts of the transistor 10 of FIGS. 1 to 3 are given the same reference numerals as the embodiment of FIGS. 1 to 3.

In the transistor 30, however, the base resistor portion 27' is between the buried layer 14 part of the collector and the additional emitter 18'. The additional emitter 18' encircles the part of the base to which the base contact 24' is provided at the contact-bearing surface of the device. Again, the base contact 24' spans a part of the emitter-base P-N junction and makes contact with the additional emitter 18', and for convenience of fabrication, the contact 24' may extend beyond the emitter-base P-N junction at two opposing points. The cross-sectional area of the base 19 transverse to the direction of movement of charge carriers between the base contact 24' and the emitters 16 and 17 is smaller for the resistor portion 27' than for the first region 25'. Further, the effective area of the base resistor portion 27' is restricted by the spread of the depletion layers associated with the emitter-base and collector-base P-N junctions into the base resistor portion 27' during operation of the device. Such an arrangement requires less area of the epitaxial layer 13 than the multi-emitter transistor 10 of FIG. 3.

The base resistor portion may be between the additional emitter and the collector in an arrangement in which the additional emitter does not encircle the part of the base to which the base contact is provided.

Other forms of transistor construction than the collector-diffusion-isolation construction, but which have a high inverse gain value, may have an additional, feedback emitter in accordance with the present invention. Thus, it is possible to reduce the magnitude of the unwanted current leakage, and also reduce the switching time of the device. Transistors provided in shallow epitaxial layers usually have high inverse current gain values. Further, the transistor may have only one emitter in the first region of the base.

What we claim is:

1. A transistor having a high inverse current gain value, comprising a collector, a base comprising a first region, a second region and a resistor portion connecting said first region to said second region, a base contact to the second region, at least one emitter within the first region, and an additional emitter within said second region, said additional emitter being adjacent to the base contact and directly connected to the base.

2. A transistor as claimed in claim 1 having a plurality of emitters within the first region of the base.

3. A transistor as claimed in claim 1 which is formed in a semiconductor body comprising an epitaxial layer of one conductivity type on a semiconductor substrate of the same conductivity type, the transistor having a collector of the opposite conductivity type comprising both a heavily doped isolation barrier for the transistor and a heavily doped buried layer at the interface between the epitaxial layer and the substrate, the isolation barrier extending through the epitaxial layer into contact with the buried layer.

4. A transistor as claimed in claim 1 in which the base contact spans a part of the P-N junction between the base and the additional emitter forming a common contact to the base and the additional emitter.

5. A transistor as claimed in claim 1 in which the cross-sectional area of the base transverse to the direction of movement of charge carriers between the base contact and each emitter within the first region is smaller for the resistor portion than for the first region.

6. A transistor as claimed in claim 1 in which the base resistor portion is between the additional emitter and the collector of the transistor.

7. A transistor as claimed in claim 6 having the additional emitter encircling a part of the base to which the base contact is provided.

8. A transistor as claimed in claim 6 in which the cross-sectional area of the base transverse to the direction of movement of charge carriers between the base contact and each emitter within the first region is smaller for the resistor portion than for the first region.

9. A transistor as claimed in claim 6 in which the base contact spans a part of the P-N junction between the base and the additional emitter forming a common contact to the base and the additional emitter.

10. A transistor formed in an epitaxial layer of one conductivity type on a substrate of the same conductivity type and having a high inverse current gain value comprising a collector of the opposite conductivity type comprising both a heavily doped isolation barrier and a heavily doped buried layer, said isolation barrier extending through the epitaxial layer into contact with the buried layer, a base comprising a first region, a second region and a resistor portion connecting said first region to said second region, at least one emitter within said first region, a feedback emitter within said second region, and a base contact spanning the junction between the base and the feedback emitter forming a common contact to the base and said feedback emitter.

11. A transistor as claimed in claim 10 in which the cross sectional area of the base transverse to the direction of movement of charge carriers between the base contact and each emitter within the first region is smaller for the resistor portion than for the first region, and said resistor portion being defined between a first part of the collector and a second part of the collector extending between said first and said second base regions.

* * * * *

UNITED STATES PATENT OFFICE

CERTIFICATE OF CORRECTION

Patent No. 3,766,449 Dated October 16, 1973

Inventor(s) Jeffrey Alan Bruchez

It is certified that error appears in the above-identified patent and that said Letters Patent are hereby corrected as shown below:

On the front page, the format failed to include the priority information which should appear after line "[21]" as follows: [30] Foreign Application Priority Data March 26, 1971 Great Britain 8719/71; Column 3, line 50, "we" should read --I--.

Signed and sealed this 5th day of March 1974.

(SEAL)
Attest:

EDWARD M.FLETCHER,JR.
Attesting Officer

C. MARSHALL DANN
Commissioner of Patents